(12) United States Patent
Kruiskamp et al.

(10) Patent No.: US 10,425,073 B1
(45) Date of Patent: Sep. 24, 2019

(54) DIGITAL ACTIVE DIODE CIRCUIT

(71) Applicant: Dialog Semiconductor B.V., s-Hertogenbosch (NL)

(72) Inventors: Marinus Wilhelmus Kruiskamp, Den Bosch (NL); Petrus Hendrikus Seesink, Ouddorp (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 15/933,493

(22) Filed: Mar. 23, 2018

(51) Int. Cl.
*H03K 17/06* (2006.01)
*H03K 17/687* (2006.01)
*H03K 17/30* (2006.01)

(52) U.S. Cl.
CPC ......... *H03K 17/063* (2013.01); *H03K 17/302* (2013.01); *H03K 17/687* (2013.01)

(58) Field of Classification Search
None
See application file for complete search history.

(56) References Cited

U.S. PATENT DOCUMENTS

| | | | | | |
|---|---|---|---|---|---|
| 4,417,164 | A | * | 11/1983 | Edlund | G06G 7/64 327/389 |
| 5,506,527 | A | * | 4/1996 | Rudolph | G06G 7/62 327/104 |
| 7,183,834 | B2 | * | 2/2007 | Nadd | H02M 1/08 327/404 |
| 7,199,636 | B2 | * | 4/2007 | Oswald | H02M 3/1588 327/313 |
| 8,134,847 | B2 | * | 3/2012 | Trattler | H02M 3/1588 363/21.14 |
| 8,354,871 | B2 | * | 1/2013 | Rao | H03F 1/0222 327/330 |
| 9,755,629 | B2 | * | 9/2017 | Ali | H03K 17/063 |
| 2016/0241225 | A1 | | 8/2016 | Ali | |

OTHER PUBLICATIONS

"0.5-V Input Digital Low-Dropout Regulator (LDO) with 98.7% Current Efficiency in 65 nm CMOS," by Yasuyuki Okuma et al., IEICE. Transactions Electronics, vol. E94-C, No. 6 Jun. 2011, pp. 938-944.

* cited by examiner

*Primary Examiner* — Jeffery S Zweizig
(74) *Attorney, Agent, or Firm* — Saile Ackerman LLC; Stephen B. Ackerman

(57) ABSTRACT

A digital active diode circuit for letting current pass in one direction and substantially blocking current in the opposite direction is presented. The circuit contains switching means comprising an array of switches, a first comparison unit coupled to the digital active diode circuit input and output. The first comparison unit updates its output if the difference between their inputs is higher than a first threshold voltage, and a second comparison unit being coupled to the digital active diode circuit output and input. The second comparison unit updates its output if the difference between its inputs is lower than a second threshold voltage. The switching means switches on or off at least one switch based on the comparisons performed by the first comparison unit and the second comparison unit and wherein the first threshold voltage is different from the second threshold voltage.

18 Claims, 17 Drawing Sheets

DIGITAL ACTIVE DIODE CIRCUIT

TECHNICAL FIELD

The invention relates to a digital active diode circuit. The invention further relates to a method for a digital active diode circuit.

BACKGROUND

An ideal diode should be very low-Ohmic for currents in forward direction and block current in reverse direction. A well-known circuit to achieve this is an active diode implemented by a large pass-transistor which is controlled by an amplifier. In order to have a low-Ohmic forward conduction, the pass transistor must be very large. The gate of this large pass-transistor is the load of the amplifier. An amplifier that has a fast response while driving a large capacitive load usually consumes a significant amount of power. Another option is to replace the amplifier with a comparator, but that may cause instability because when the comparator switches the pass transistor ON, switch resistance drops and as a result the voltage drop across the switch also drops and the comparator turns the switch OFF, switch resistance increases, increasing the voltage drop switch and so on.

US2016241225 discloses an active diode circuit for letting current pass in one direction and for blocking current in the opposite direction wherein the active diode circuit comprises a transistor, a control voltage generation circuit for generating a control voltage that is supplied to a control terminal of the transistor, and a sensing circuit for detecting a quantity indicative of a current flowing through the transistor, wherein the control voltage generation circuit generates the control voltage based on the detected quantity. The idea behind this current controlled active diode is to operate the transistor as a switch if forward current is above a certain threshold and drive it by the amplifier if current is below that threshold. However, it still has the drawback of having an amplifier driving the large pass transistor (at least during the moments when forward current is below the threshold).

0.5-V Input Digital Low-Dropout Regulator (LDO) with 98.7% Current Efficiency in 65 nm CMOS, EICE TRANS. ELECTRON., VOL. E94-C, NO. 6 Jun. 2011 by Yasuyuki Okuma, Koichi Ishida, Yoshikatsu Ryu, Xin Zhang, Po-Hung Chen, Kazunori Watanabe, Makoto Takamiya and Takayasu Sakura discloses a digital LDO including a switch array, a comparator controller (a serial-in parallel-out bi-directional shift register), and a digital controller wherein the comparator controller monitors the output voltage of the LDO and wherein the number of turned on switches is changed digitally by the digital controller based on the monitoring performed by the comparator controller.

SUMMARY

It would be advantageous to have an improved active diode circuit. To better address this concern, a first aspect of the invention provides a digital active diode circuit for letting current pass in one direction and substantially blocking current in the opposite direction, the digital active diode circuit may comprise:
  a digital active diode circuit input terminal;
  a digital active diode circuit output terminal;
  switching means comprising an input terminal being coupled to the digital active diode circuit input terminal, an output terminal being coupled to the digital active diode circuit output terminal, and an array of switches comprising a plurality of switches;
  a first comparison unit comprising a first input terminal being coupled to the digital active diode circuit input terminal, a second input terminal being coupled to the digital active diode circuit output terminal, and an output terminal being coupled to the switching means, wherein the first comparison unit is further configured to update the output terminal if the difference between the first input terminal and the second input terminal is higher than a first threshold voltage; and
  a second comparison unit comprising a first input terminal being coupled to the digital active diode circuit output terminal, a second input terminal being coupled to the digital active diode circuit input terminal, and an output terminal being coupled to the switching means, wherein the second comparison unit is further configured to update the output terminal if the difference between the first input terminal and the second input terminal is lower than a second threshold voltage;
  wherein the switching means is further configured to switch on or off at least one of the plurality of switches based on the comparisons performed by the first comparison unit and the second comparison unit, and wherein the first threshold voltage is different from the second threshold voltage.

In this way, the digital active diode circuit provides a fast time response without a high quiescent power consumption. The two comparators having a small and unequal offset prevent unnecessary toggling of the switches when current is almost constant. Because the lack of an analog amplifier controlling the large pass transistor, it is possible to get a fast response with a very low quiescent power. Another benefit of the digital active diode is that an estimate of the diode current is available as a digital number (based on the state of the switches). This digital number information can therefore easily be used by the rest of the system.

The first comparison unit may comprise a first operational amplifier having an inverting input, a non-inverting input and an output, wherein the non-inverting input may be coupled to the first input terminal of the first comparison unit, the inverting input may be coupled to the second input terminal of the first comparison unit through an offset voltage equal to the first threshold voltage, and the output of the first operational amplifier may be coupled to the output terminal of the first comparison unit.

The second comparison unit may comprise a second operational amplifier with an inverting input, a non-inverting input and an output, wherein the inverting input may be coupled to the second input terminal of the second comparison unit, the non-inverting input may be coupled to the first input terminal of the second comparison unit through an offset voltage equal to the second threshold voltage, and the output may be connected to the output terminal of the second comparison unit.

The switching means may further comprise a selecting unit comprising a first input coupled to the output of the first comparison unit, a second input coupled to the output of the second comparison unit and a plurality of outputs, wherein each output of the plurality of outputs of the selecting unit may be coupled to a different switch of the plurality of switches.

The selecting unit may be a bidirectional register.

The number of switches of the plurality of switches may be equal to the number of outputs of the plurality of outputs of the selecting unit.

The array of switches may be binary weighted. A progressive scaling of the switches, like binary, reduces the response time to variations of the diode current. I.e., the binary weighting of the switches makes that the response-time is fast. However, the array of switches may be scaled in any other suitable way.

The number of switches may be equal to 8, binary scaled from 1 unit to 128 units. In this way, it will take only 8 clocks for the switches to go from all-ON to all-OFF and vice versa.

The switches may be transistors. This is a very efficient implementation of the switches.

The first threshold voltage may be equal to four times the second threshold voltage.

The digital active diode circuit may further comprise a stabilization circuit wherein the stabilization circuit may further comprise an amplifier, a switch and a voltage source wherein the voltage source may be configured to provide a voltage equal to half of the result of adding the first threshold voltage and the second threshold voltage, and wherein the amplifier comprises an inverting input coupled to the input terminal of the digital active diode circuit, a non-inverting terminal coupled to the voltage source and an output coupled to the switch. By adding this small amplifier controlling a very small switch (equal in size to the smallest switch that is digitally controlled), instability at very low current levels is prevented. In this way, a fast response at a low quiescent power consumption is achieved, since the analog amplifier is only driving a very small switch.

The digital active diode circuit may further comprise a clock connected to the switching means, to the first comparison unit, and to the second comparison unit. This allows that the comparison units and the switching mean are synchronous (clocked). However, the comparison units and the switching means could be also asynchronous (not clocked).

Method claims are provided in addition to the digital active diode claims.

BRIEF DESCRIPTION OF THE DRAWINGS

These and other aspects of the invention are apparent from and will be elucidated with reference to the embodiments described hereinafter. In the drawings.

DESCRIPTION

Although the system is described herein in detail, it will be understood that for many features described herein, alternative solutions may be used without departing from the scope of the claims.

Figure 1:
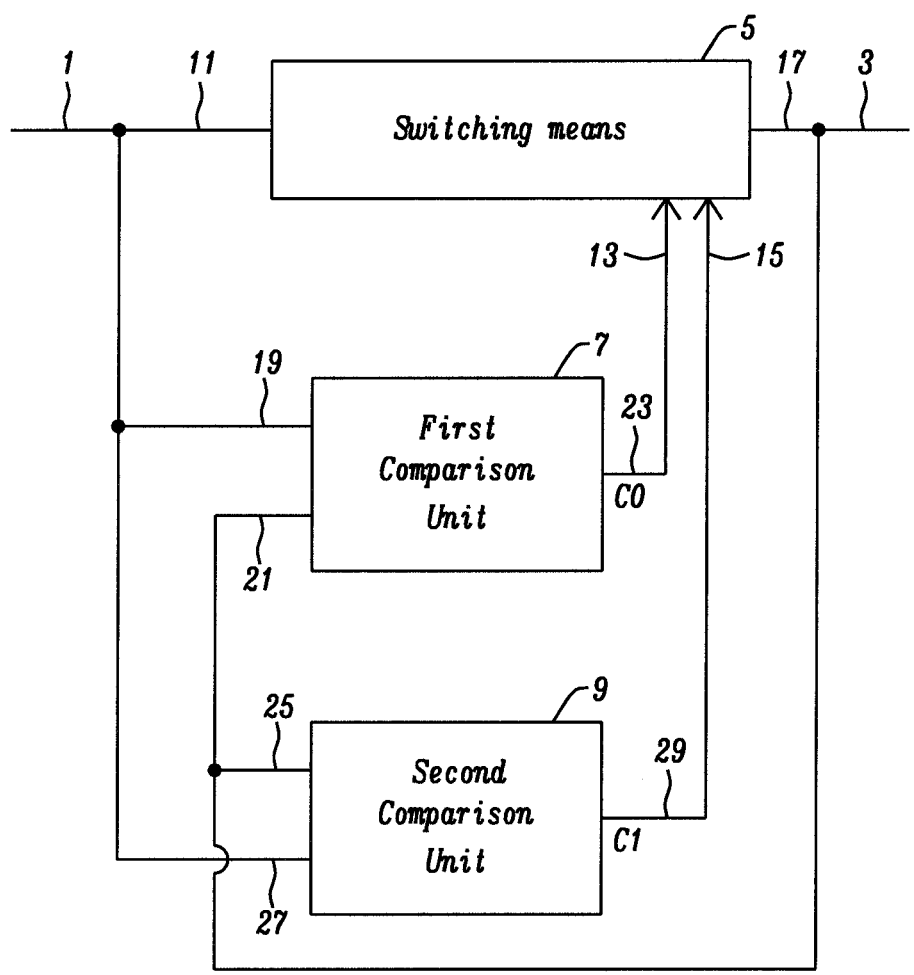
FIG. 1 illustrates a digital active diode circuit according to one embodiment of the invention.

FIG. 1 is a diagram illustrating aspects of a digital active diode circuit. The digital active diode circuit of FIG. 1 comprises an input terminal 1, an output terminal 3, switching means 5, a first comparison unit 7, and a second comparison unit 9. The switching means 5 comprises a first input terminal 11, a second input terminal 13, a third input terminal 15 and an output terminal 17 wherein the first input terminal 11 is connected to the input terminal 1 of the digital active diode circuit and the output terminal 17 is connected to the output terminal 3 of the digital active diode circuit.

The first comparison unit 7 comprises a first input terminal 19, a second input terminal 21, and an output terminal 23 wherein the first input terminal 19 is connected to the input terminal 1 of the digital active diode circuit, the second input terminal 21 is connected to the output terminal 3 of the digital active diode circuit and the output terminal 23 is connected to the second input terminal 13 of the switching means.

The second comparison unit 9 comprises a first input terminal 25, a second input terminal 27, and an output terminal 29 wherein the first input terminal 25 is connected to the output terminal 3 of the digital active diode circuit, the second input terminal 27 is connected to the input terminal 1 of the digital active diode circuit and the output terminal 29 is connected to the third input terminal 15 of the switching means 5.

The first comparison unit 7 is configured to compare the voltage at the input terminal 1 of the digital active diode circuit to the voltage at the output terminal 3 of the digital active diode circuit plus a first predetermined voltage threshold or to compare the voltage at the input terminal 1 of the digital active diode circuit minus the first predetermined voltage threshold to the voltage at the output terminal 3 of the digital active diode circuit. The first comparison unit 7 is further configured to generate a (e.g. binary) control signal $C_0$ at the output terminal 23 of the first comparison unit 7 based on the result of the comparison. For instance, the binary control signal $C_0$ goes to one if the voltage at the input terminal 1 of the digital active diode circuit minus the voltage at the output terminal 3 of the digital active diode circuit is more than the first predetermined voltage threshold.

The second comparison unit 9 is configured to compare the voltage at the output terminal 3 of the digital active diode circuit plus a second predetermined voltage threshold to the voltage at the input terminal 1 of the digital active diode circuit or to compare the voltage at the output terminal 3 of the digital active diode circuit to the voltage at the input terminal 1 of the digital active diode circuit minus the second predetermined voltage threshold. The second comparison unit 9 is further configured to generate a (e.g. binary) control signal $C_1$ at the output terminal 29 of the second comparison unit 9 based on the result of the comparison. For instance, the binary control signal $C_1$ goes to one if the voltage at the input terminal 1 of the digital active diode circuit minus the voltage at the output terminal 3 of the digital active diode circuit is less than the second predetermined voltage threshold.

The comparisons may be performed in any way. The control signals $C_0$ and $C_1$ may be an indication of the result of the comparison performed by the comparison units 7 and 9, respectively. The control signals $C_0$ and $C_1$ may independently go to a high level or to zero based on the comparison results of the first and second comparison units, respectively. For instance, if the voltage at the input terminal 1 of the digital active diode circuit minus the voltage at the output terminal 3 of the digital active diode circuit is more than the first predetermined voltage threshold, i.e., if the voltage difference between the input terminal 1 and the output terminal 3 excess the first predetermined voltage threshold, the control signal $C_0$ goes to a high level, i.e., a positive value. However, depending on the overall configuration of the circuit of FIG. 1, the control signal $C_0$ may also go to zero at this point, as the skilled person will appreciate. Here, the high level and the zero level are to be understood to serve as examples for two distinct levels of a multi-level signal, and the present disclosure is not to be construed as being limited to these exemplary levels, or to a binary signal. The same applies to the second comparison unit 9 when the voltage difference between the input terminal 1 and the output terminal 3 is less than the second predetermined voltage threshold.

The digital active diode circuit of FIG. 1 further comprises the switching unit 5. The switching unit 5 comprises a first input terminal 11, a second input terminal 13, a third input terminal 15, and an output terminal 17. The first input terminal 11 is connected to the input terminal 1 of the digital active diode circuit and the output terminal 17 is connected to the output terminal 3 of the digital active diode circuit. The second input terminal 13 is connected to the output terminal 23 of the first comparison unit 7 and the third input terminal 15 is connected to the output terminal 29 of the second comparison unit 9. The switching unit 5 of FIG. 1 comprises further an array of switches (not shown in FIG. 1) wherein the array of switches comprises a plurality of switches. The switching unit 5 is configured to receive the control signal $C_0$ from the first comparison unit 7, to receive the control signal $C_1$ from the second comparison unit 9, and to selectively switch on or off one or more of the plurality of switches of the array of switches based on the received control signals $C_0$ and $C_1$. I.e., the array of switches may be switched under control of the binary signals $C_0$ and $C_1$.

The purpose of the digital active diode circuit of FIG. 1 is to keep the voltage difference between the input terminal 1 and the output terminal 3 of the digital active diode between two voltage values, $V_{high}$ and $V_{low}$, as long as current is flowing in a forward direction (i.e., from the input terminal 1 towards the output terminal 3), and to prevent current flowing in a reverse direction (i.e., from the output terminal 3 towards the input terminal 1). This is monitored by the first comparison unit 7 and the second comparison unit 9, wherein the first predetermined voltage threshold is equal to $V_{high}$ and the second predetermined voltage threshold is equal to $V_{low}$. When the voltage difference between the input terminal 1 and the output terminal 3 is more than $V_{high}$ i.e., more than the first predetermined voltage threshold, the signal $C_0$ goes to a high level and the switching unit may switch one or more of the switches on in order to reduce the voltage difference between the input terminal 1 and the output terminal 3 such that it is again between $V_{high}$ and $V_{low}$. When the voltage difference between the input terminal 1 and the output terminal 3 is less than $V_{low}$, i.e., less than the second predetermined voltage threshold, the signal $C_1$ goes to a high level and the switching unit may switch one or more of the switches off in order to increase the voltage difference between the input terminal 1 and the output terminal 3.

The first predetermined voltage threshold and the second predetermined voltage threshold may be small values. $V_{high}$ may be equal to four times $V_{low}$. However, $V_{high}$ and $V_{low}$ may have any suitable value.

Figure 2:
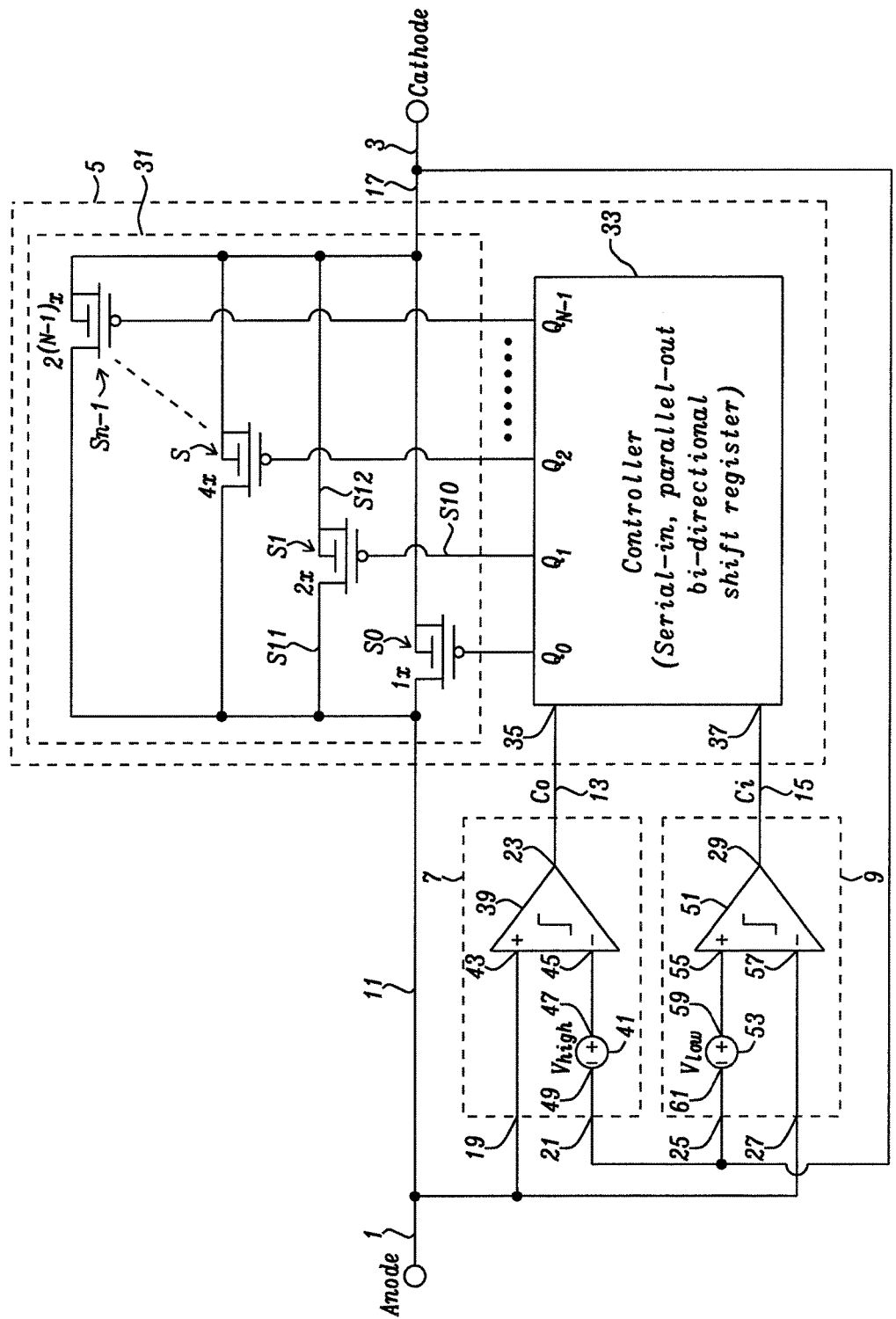
FIG. 2 illustrates further aspects of the active diode circuit of FIG. 1.

FIG. 2 illustrates further aspects of the active diode circuit of FIG. 1 in which the same reference numbers refer to the same components as in FIG. 1.

The switching unit 5 of FIG. 2 comprises an array of switches 31 and a control unit 33.

The array of switches 31 comprises a plurality of switches $S_i$ (i=0, 1 . . . N−1). Each one of these switches $S_i$ has a first end $s_{i1}$, a second end $s_{i2}$, and a control terminal $s_{ic}$. For the sake of simplicity, a switch $S_i$ will be called an $i^{th}$ switch in the specification hereinafter. The first end $s_{i1}$ of the plurality of switches $S_i$ is connected to the input terminal 1 of the digital active diode circuit. The second end $s_{i2}$ of the plurality of switches $S_i$ is connected to the output terminal 3 of the digital active diode circuit. In this way, the plurality of switches $S_i$ are connected in parallel to each other. However, other suitable configurations are possible.

The control unit 33 comprises a first input terminal 35, a second input terminal 37 and a plurality of output terminals $Q_i$ (i=0, 1 . . . N−1) wherein each of the plurality of output terminals $Q_i$ is connected to the respective control terminal $s_{ic}$ of the respective switch $S_i$. The first input terminal 35 is connected to the output terminal 23 of the first comparison unit 7 and the second input terminal 35 is connected to the output terminal 29 of the second comparison unit 9.

Each of the plurality of switches $S_i$ may implemented with a transistor $T_i$ (e.g., a MOSFET, such as a PMOS or an NMOS, for example) having a gate, a drain and a source wherein the gate of the transistor $T_i$ is connected to the control terminal $s_{ic}$, the drain of the transistor $T_i$ is connected to the first end $s_{i1}$, and the source of the transistor $T_i$ is connected to the second end $s_{i2}$. However, each of the plurality of switches $S_i$ may implemented with any number of transistors or with any suitable element. The width of each of the transistors $T_i$ may be different. For instance, the transistor $T_0$ may have the smallest width and the transistor $T_{N-1}$ may have the largest width. The transistors may be binary weighted. For instance, the width of the transistor $T_m$ may be twice the width of the transistor $T_{m-1}$ In this way, the current that flows through transistor $T_m$, has a fixed ratio to the one flowing through transistor $T_{m-1}$ as determined by their relative surface areas.

The first comparison unit 7 comprises a comparator 39 and a first voltage source 41. The comparator 39 comprises a non-inverting input 43, an inverting input 45 and an output connected to the output terminal 23 of the first comparison unit 7. The non-inverting input 43 is connected to the first input terminal 19 of the first comparison unit 7. The first voltage source 41 has a positive terminal 47 and a negative terminal 49 wherein the positive terminal 47 is connected to the inverting input 45 of the comparator 39 and the negative terminal 49 is connected to the second input terminal 21 of the first comparison unit 7.

The second comparison unit 9 comprises a comparator 51 and a second voltage source 53. The comparator 51 comprises a non-inverting input 55, an inverting input 57 and an output connected to the output terminal 29 of the second comparison unit 9. The inverting input 57 is connected to the second input terminal 27 of the second comparison unit 9. The second voltage source 53 has a positive terminal 59 and a negative terminal 61 wherein the positive terminal 59 is connected to the non-inverting input 55 of the comparator 51 and the negative terminal 61 is connected to the first input terminal 25 of the comparison unit 9.

The switches may be controlled by a thermometer-code, i.e., the switches may go from all switches OFF to all switches ON by sequentially turning ON from switch $S_0$ until switch $S_{n-1}$ (so if switch $S_m$ is ON and switch $S_{m+1}$ is OFF, then all switches from switch $S_0$ to switch $S_m$ are ON and all switches from $S_{m+1}$ to $S_{n-1}$ are OFF). However, the switches may be controlled in any other suitable way.

The working of the digital active diode of FIG. 2 is as follows:

If the voltage difference between the input terminal 1 and the output terminal 3 of the digital active diode is within the first and the second predetermined voltage thresholds ($V_{high}$ and $V_{low}$), nothing happens.

If the voltage difference between the input terminal 1 and the output terminal 3 of the digital active diode is above the upper threshold ($V_{high}$), the switch with the smallest width among all the switches which are currently switched OFF is turned ON. This will reduce the resistance between the input terminal 1 and the output terminal 3 of the digital active diode by about a factor two thereby also reducing the voltage difference between the input terminal 1 and the output terminal 3 of the digital active diode by about a factor two (i.e., if it was just above $V_{high}$, it will come within the thresholds $V_{high}$ and $V_{low}$).

If the voltage difference between the input terminal 1 and the output terminal 3 of the digital active diode is below the lower threshold ($V_{low}$), the switch with the largest width among all the switches which are currently switched ON is turned OFF. This will increase the resistance between the input terminal 1 and the output terminal 3 of the digital active diode by about a factor two thereby also increasing the voltage difference between the input terminal 1 and the output terminal 3 of the digital active diode by about a factor two (i.e., if it was just below $V_{low}$, it will come within the thresholds $V_{high}$ and $V_{low}$.

Figure 3:
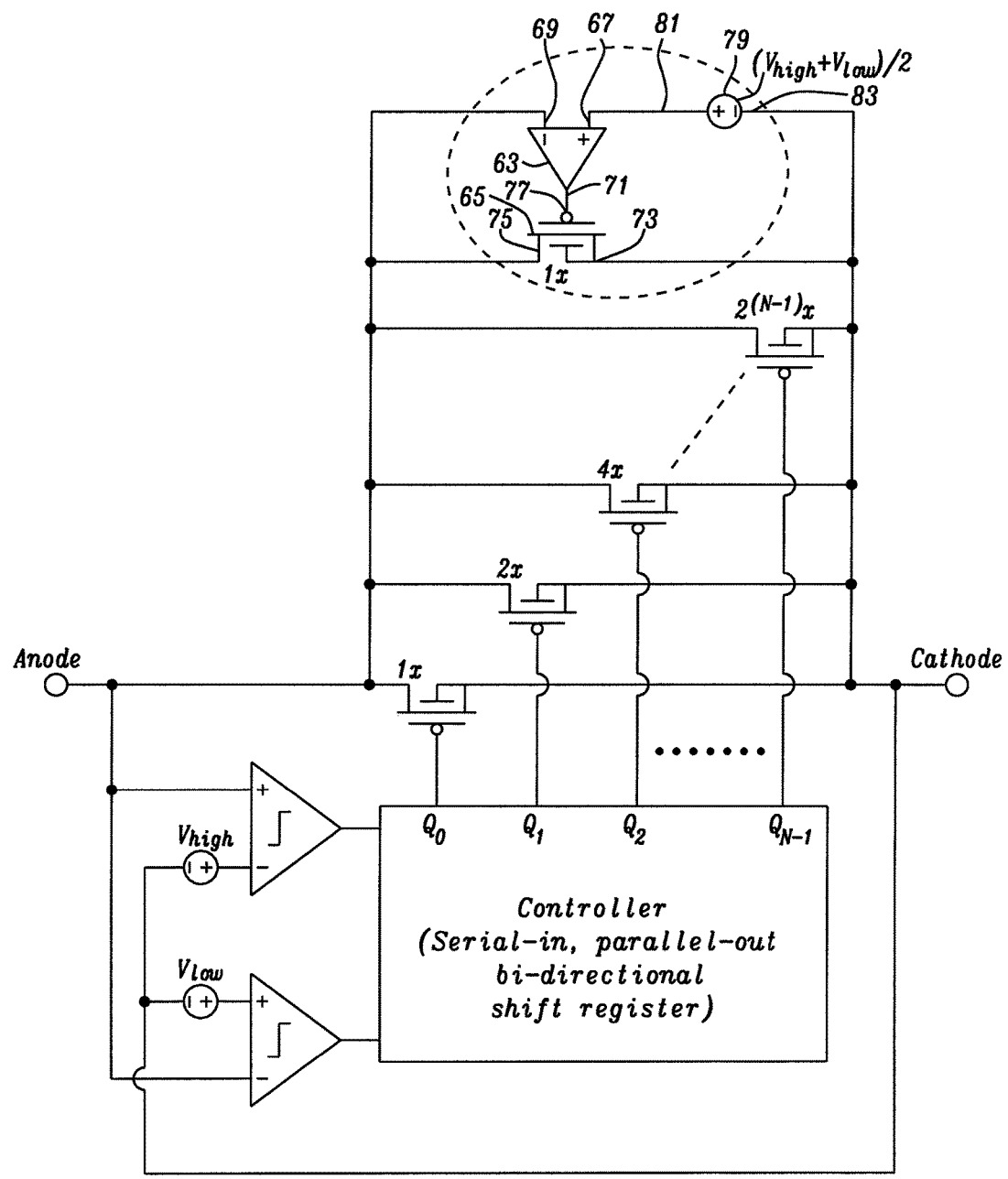
FIG. 3 illustrates a digital active diode circuit according to a second embodiment of the invention.

FIG. 3 illustrates a digital active diode circuit according to a second embodiment of the invention in which same reference number refer to the same components as in FIGS. 1 and 2. The digital active diode circuit of FIG. 3 is identical to the digital active diode circuit of FIG. 2 but further comprises an operational amplifier 63 and a switch 65.

The operational amplifier 63 comprises a non-inverting input 67, an inverting input 69 and an output 71. The switch 65 is a transistor having a source 73, a drain 75, and a gate 77. The inverting input 69 is connected to the input terminal 1 of the digital active diode circuit. The output 71 of the operational amplifier 63 is connected to the gate 77 of the transistor of the switch 65. The drain 75 and the source 73 of the transistor of the switch 65 are connected respectively to input terminal 1 and to the output terminal 3 of the digital active diode circuit.

The digital active diode circuit of FIG. 3 further comprises a third voltage source 79 having a positive terminal 81 and a negative terminal 83 wherein the positive terminal 81 is connected to the non-inverting input 67 of the operational amplifier 63 and the negative terminal 83 is connected to the output terminal 3 of the digital active diode circuit.

Figure 4:
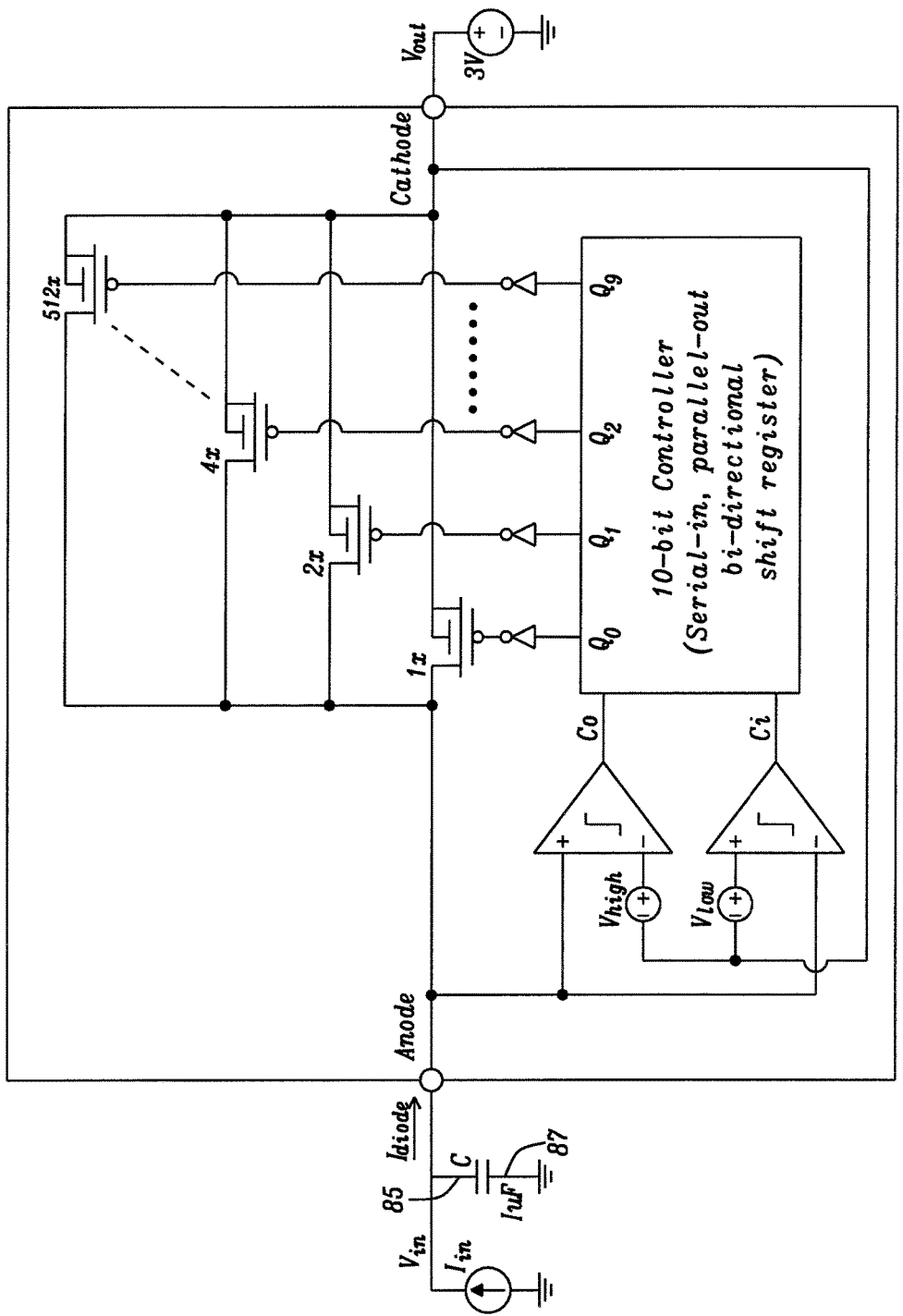
FIG. 4 is a diagram illustrating a simulated digital active diode circuit.

FIG. 4 is a diagram illustrating a simulated digital active diode circuit. Same reference number refer to the same components as in FIGS. 1 and 2. In the digital active diode circuit of FIG. 4, each unit transistor is a 5V extended drain transistor in 55 nm TSMC with W/L=2×10 um/0.5 um. The digital active diode circuit of FIG. 4 comprises a current source $I_{in}$ connected at the input terminal 1 of the digital active diode circuit which generates a voltage $V_{in}$ of 5 volts at the input terminal 1. The digital active diode circuit of FIG. 4 comprises further a capacitor C of 1 microfarads having a first end 85 and a second end 87 wherein the first end 85 is connected to the input terminal 1 and the second end 87 is connected to ground. The first predetermined voltage threshold is set by the first voltage source 41 at 5 millivolt ($V_{low}$) and the second predetermined voltage threshold is set by the second voltage source 53 at 20 millivolts ($V_{high}$).

The first comparison unit 7 and the second comparison unit 9 are continuous comparators that latch when positive input is above negative input. The first comparison unit 7 and the second comparison unit 9 are reset as soon as the control unit 33 has been updated (in 100 nanoseconds). The switching means 5 comprises a control unit 33 implemented with a shift register and having 10 output terminals $Q_0$, $Q_1$, $Q_2$, $Q_3$, $Q_4$, $Q_5$, $Q_6$, $Q_7$, $Q_8$, $Q_9$ and a switch array 31 comprising 10 switches implemented with 10 transistors $T_0$, $T_1$, $T_2$, $T_3$, $T_4$, $T_5$, $T_6$, $T_7$, $T_8$, $T_9$ Each output $Q_i$ is connected to the gate of each transistor $T_i$. I.e., $Q_0$ is connected to the gate of $T_0$, $Q_1$ is connected to the gate of $T_1$, $Q_2$ is connected to the gate of $T_2$, $Q_3$ is connected to the gate of $T_3$, $Q_4$ is connected to the gate of $T_4$, $Q_5$ is connected to the gate of $T_5$, $Q_6$ is connected to the gate of $T_6$, $Q_7$ is connected to the gate of $T_7$, $Q_8$ is connected to the gate of $T_8$, and $Q_9$ is connected to the gate of $T_9$. The output of the shift register can be represented as a binary signal having 10 bits wherein the binary signal in hexadecimal value begins at Q<9:0>=0x000. In this way, all switches are switched OFF. If the input voltage at the input terminal 1 of the digital active diode circuit is significantly above the output voltage at the output terminal 3 of the digital active diode circuit, the output of the shift register goes to Q<9:0>=0x3FF. In this way, all switches are switched ON via the following intermediate steps: 0x000→0x001→0x003→0x007→0x00F→0x01F→0x03F→0x07F→0x0FF→0x1FF→0x3FF. These steps are the only possible hexadecimal values of the output Q of the shift register, i.e, the only possible combination of states of the switches. The working of the shift register is as follows: at a "$C_0$" pulse, the shift register shifts one step in the direction described above; at a "$C_1$" pulse, the register shifts one step in opposite direction; and without a "$C_0$" nor a "$C_1$" pulse, nothing happens. This can be made at a very low power as the only static power is consumed by the two comparators (it can be below 1 microwatt each for 100 nanosecond reaction time. If the reaction time is increased, the power consumed by each comparator will be less). Other than that, the circuit only consumes current in case the diode-current has increased or decreased a factor of two and as a result of that, the number of ON-switches has to be changed by the controller.

FIG. 5, FIG. 6, FIG. 7, FIG. 8, FIG. 9, FIG. 10, FIG. 11, FIG. 12, FIG. 13, FIG. 14, FIG. 15, FIG. 16 and FIG. 17 illustrate simulation results of the digital active diode circuit of FIG. 4.

In FIG. 5, FIG. 6, FIG. 7, FIG. 8, FIG. 9, FIG. 10, FIG. 11, FIG. 12, FIG. 13, FIG. 14, FIG. 15, FIG. 16 and FIG. 17 the horizontal axes represent in milliseconds the time. The vertical axes represent: in FIG. 5, FIG. 9, FIG. 12 and FIG. 15, $I_{in}$ and $I_{diode}$, represented in milliamperes, in FIG. 6, $V_{in}$ represented in volts, in FIG. 7 FIG. 10, FIG. 13 and FIG. 16, $V_{in}$ $V_{out}$, $V_{out}+V_{high}$ and $V_{out}+V_{low}$ represented in volts, in FIG. 8, FIG. 11, FIG. 14 and FIG. 17, the binary value of $C_0$ and $C_1$, and the hexadecimal value of Q.

Figure 5:
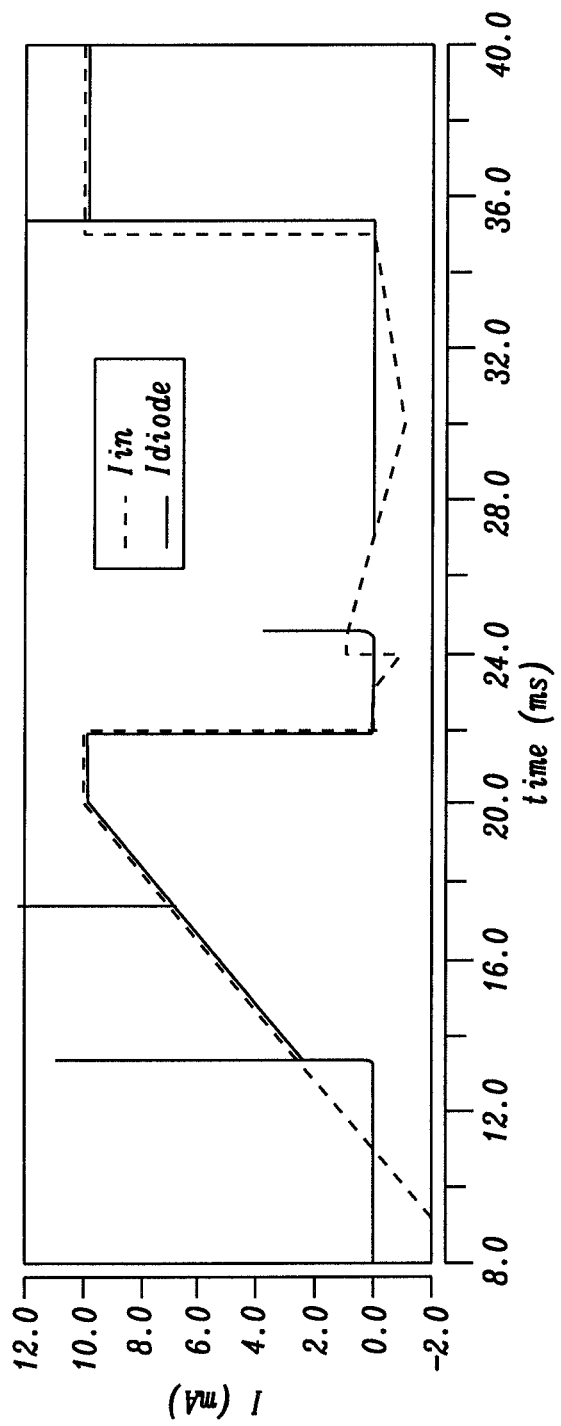
FIG. 5, FIG. 6, FIG. 7, FIG. 8, FIG. 9, FIG. 10, FIG. 11, FIG. 12, FIG. 13, FIG. 14, FIG. 15, FIG. 16, and FIG. 17 illustrate simulation results of the digital active diode circuit of FIG. 4.

In FIG. 5, first the input current $I_{in}$ is slowly increased from a negative value to 10 milliamp, then it is suddenly decreased to 100 microamperes (at time=22 millisecond), then it is made −1 milliamp, followed by a step to +1 milliamp. After that, the input current $I_{in}$ is slowly decreased and then slowly increased. Finally, the input current $I_{in}$ shows a step from 0 to 10 milliamp (at time=35 ms).

Figure 6:
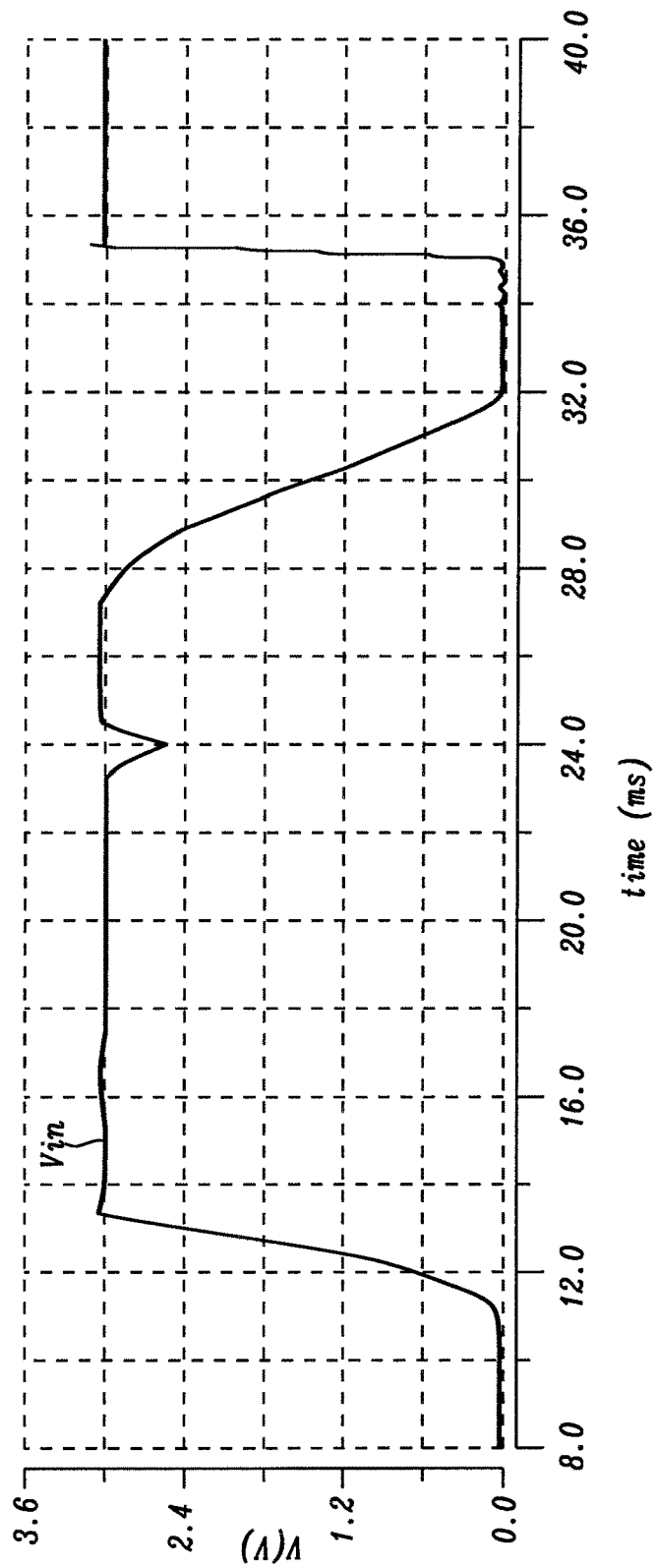
Figure 7:
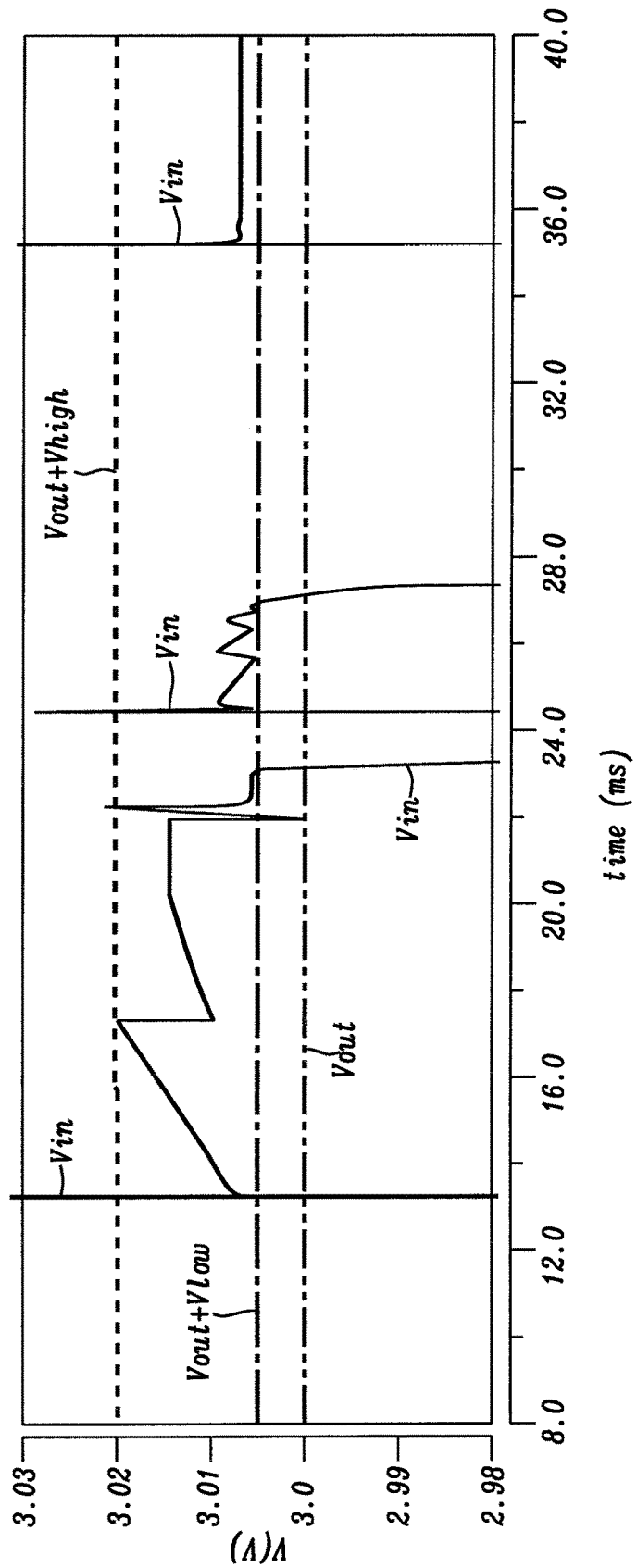
Figure 8:
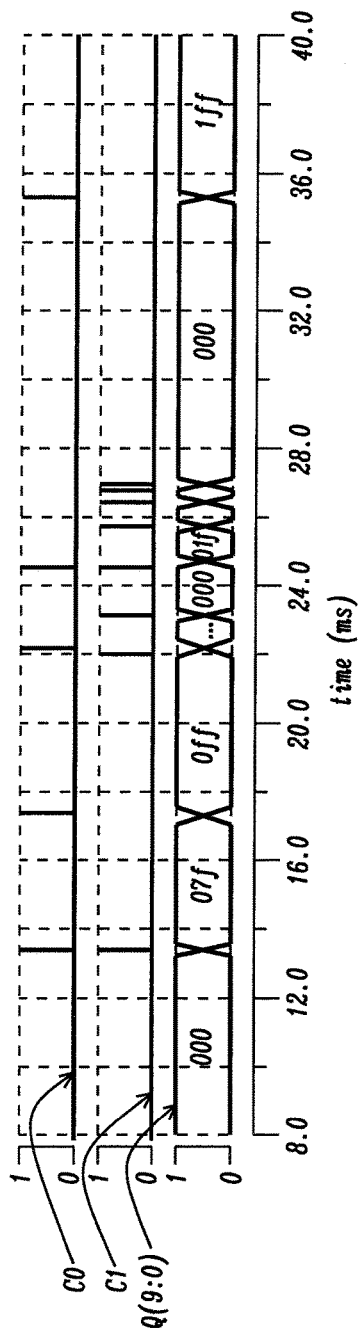
Figure 9:
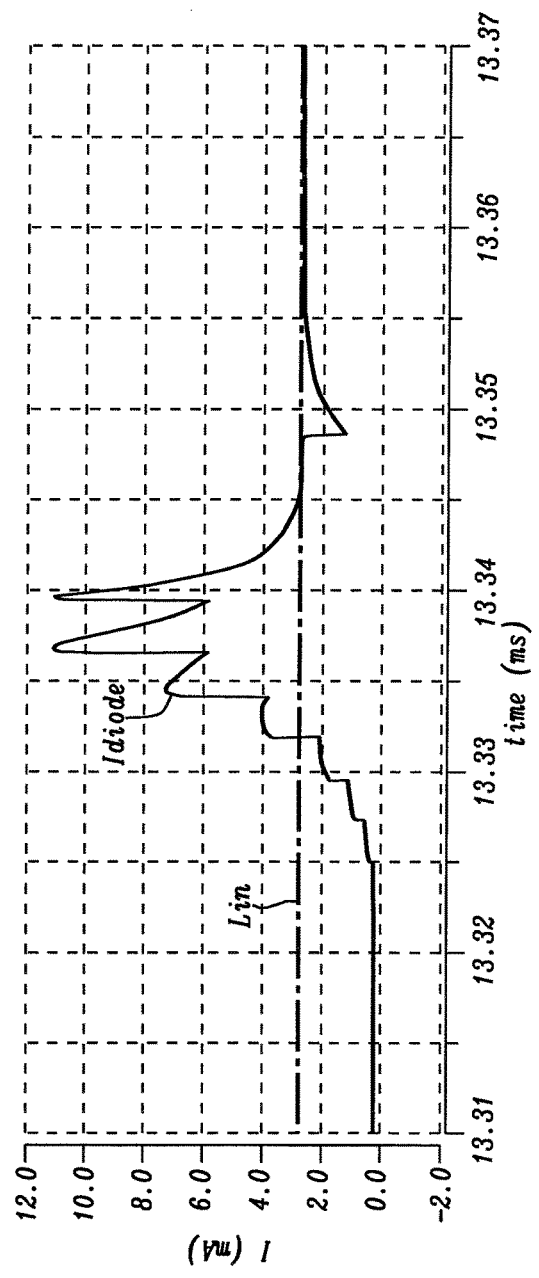
Figure 10:
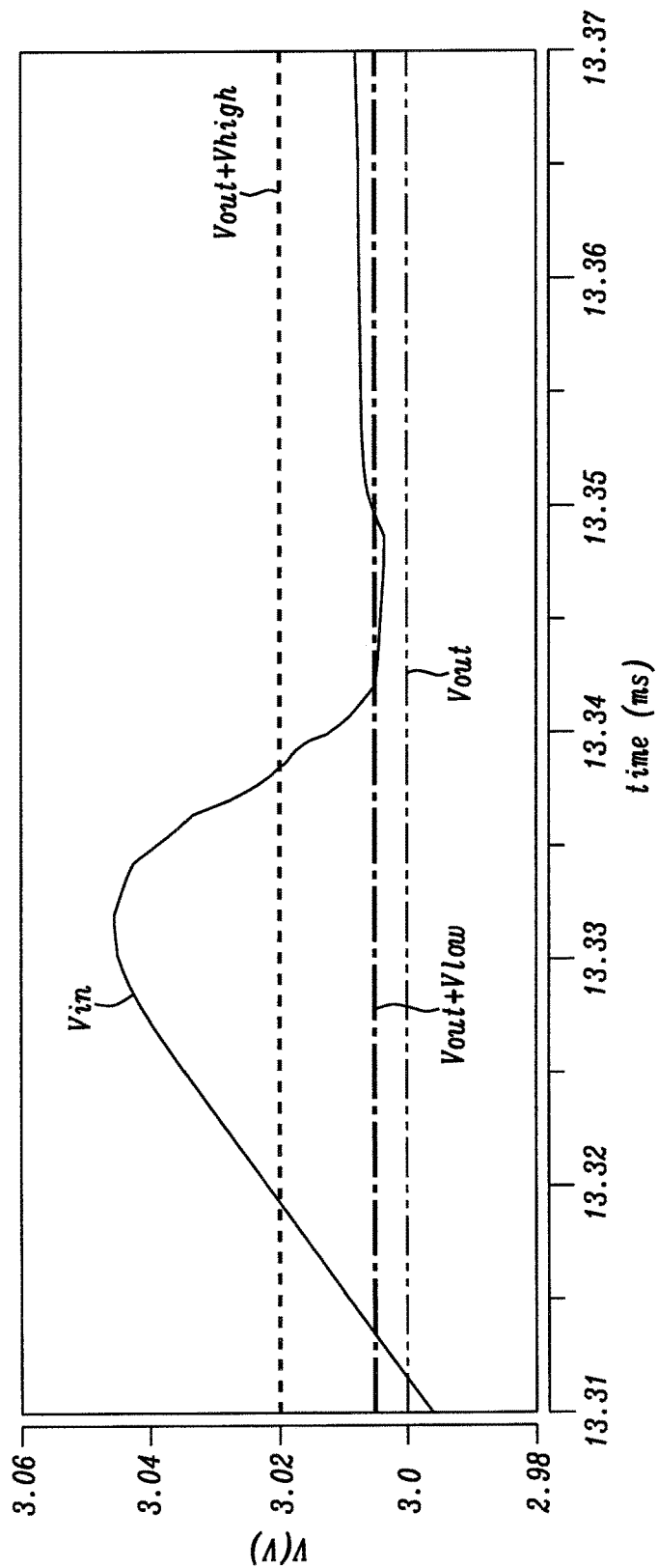
Figure 11:
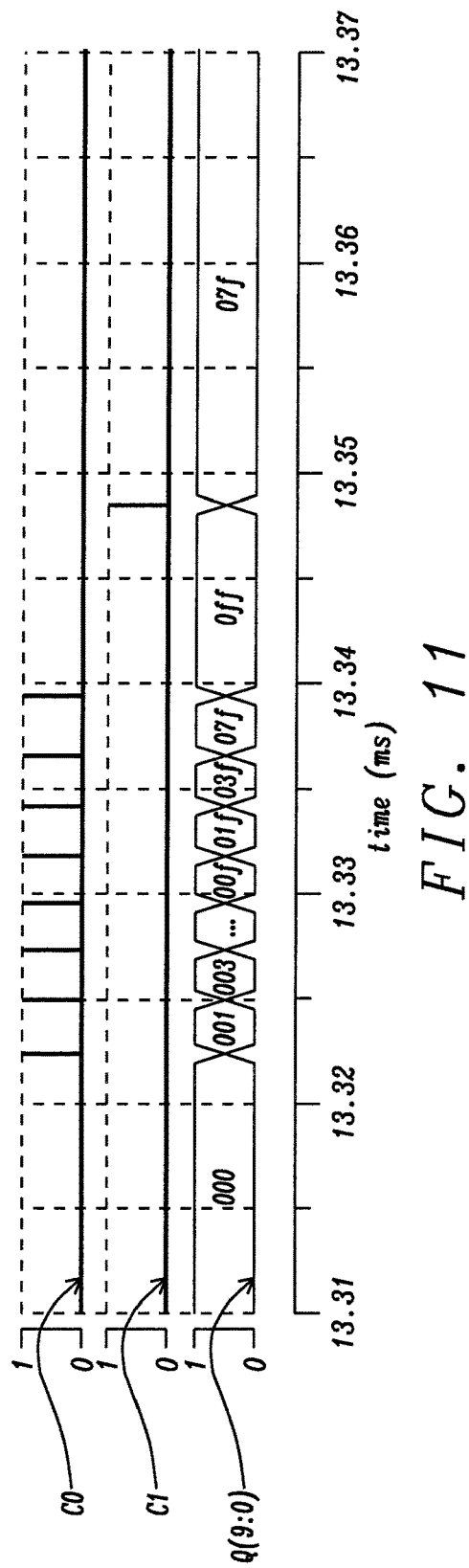
Figure 12:
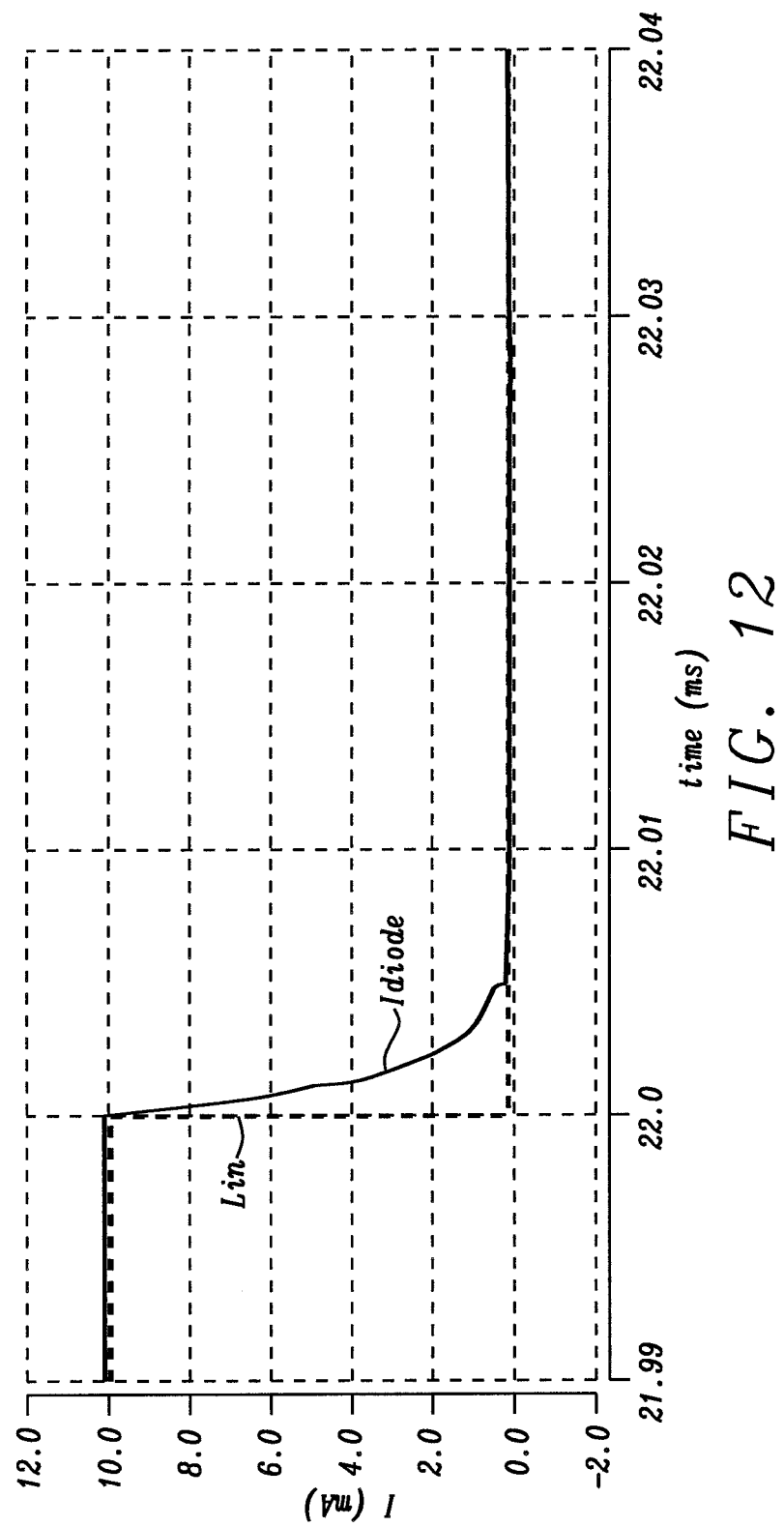
Figure 13:
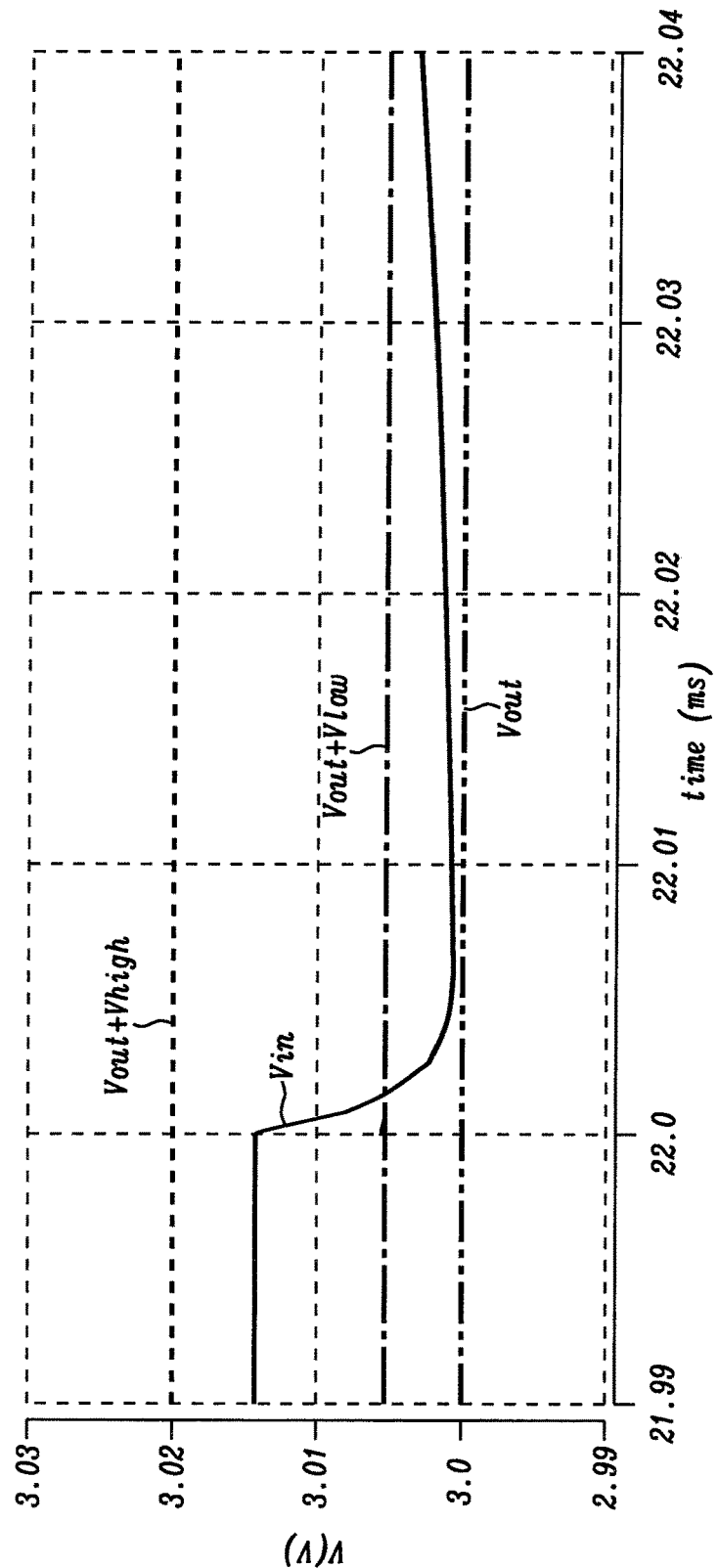
Figure 14:
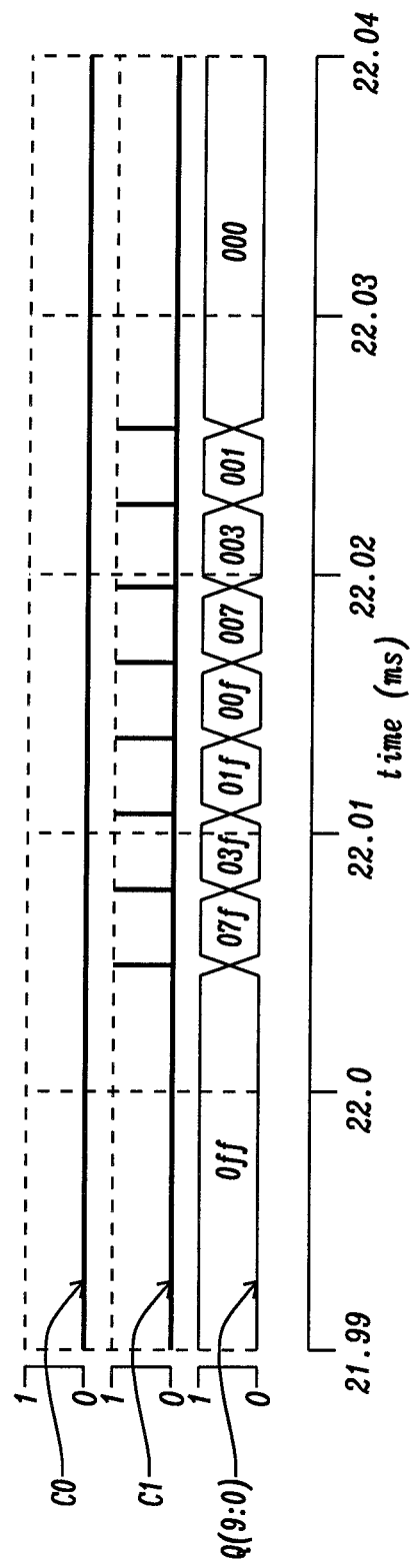
Figure 15:
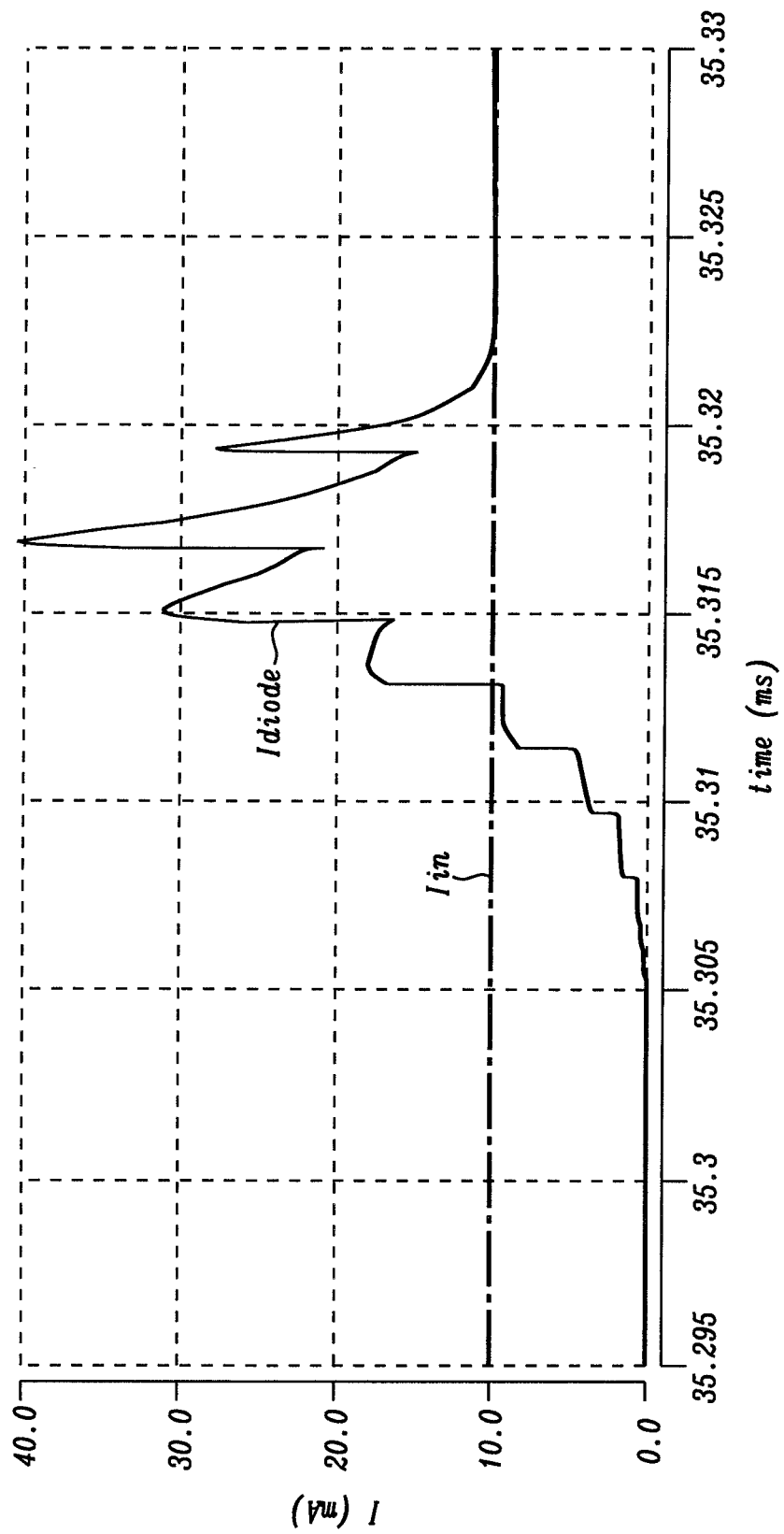
Figure 16:
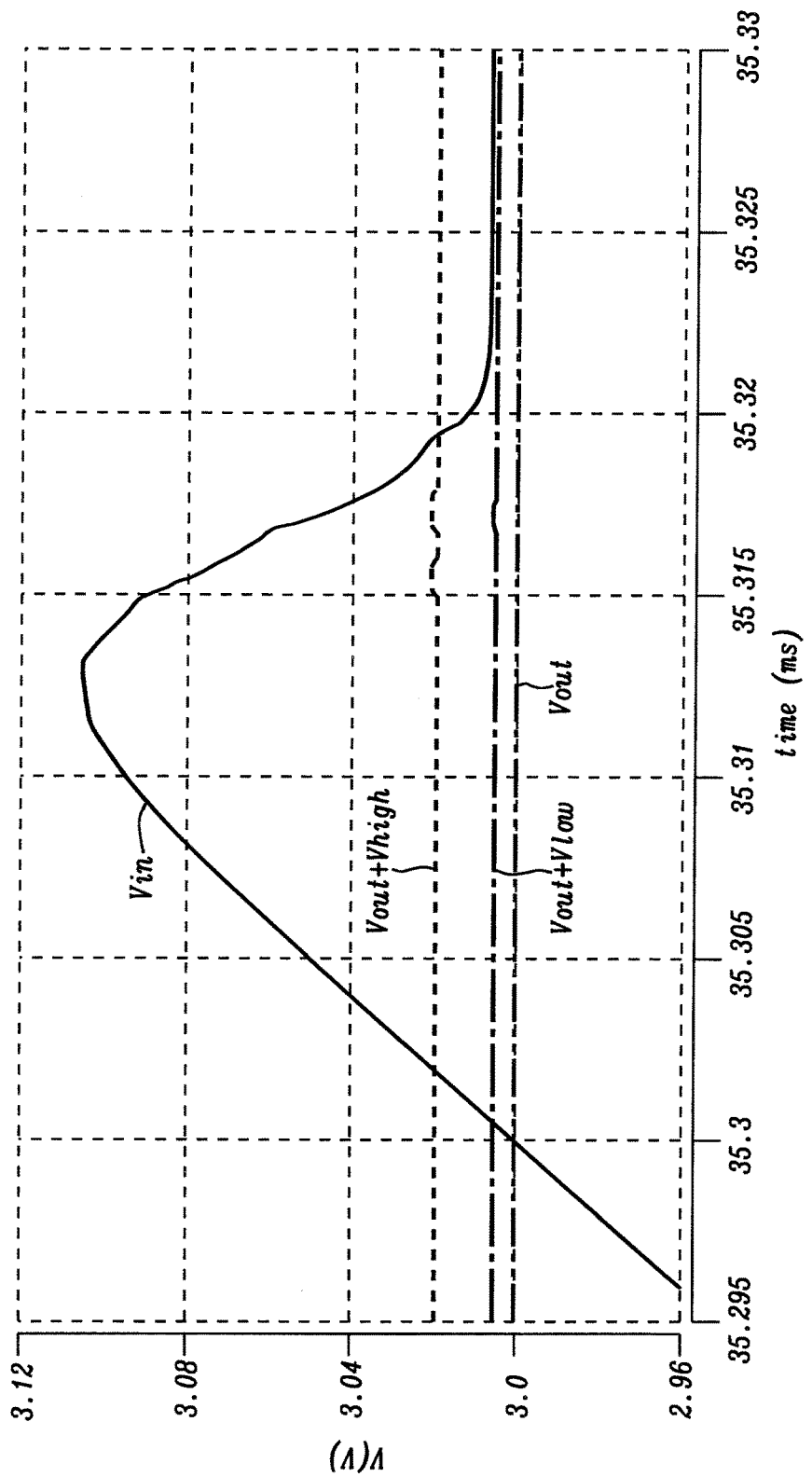
Figure 17:
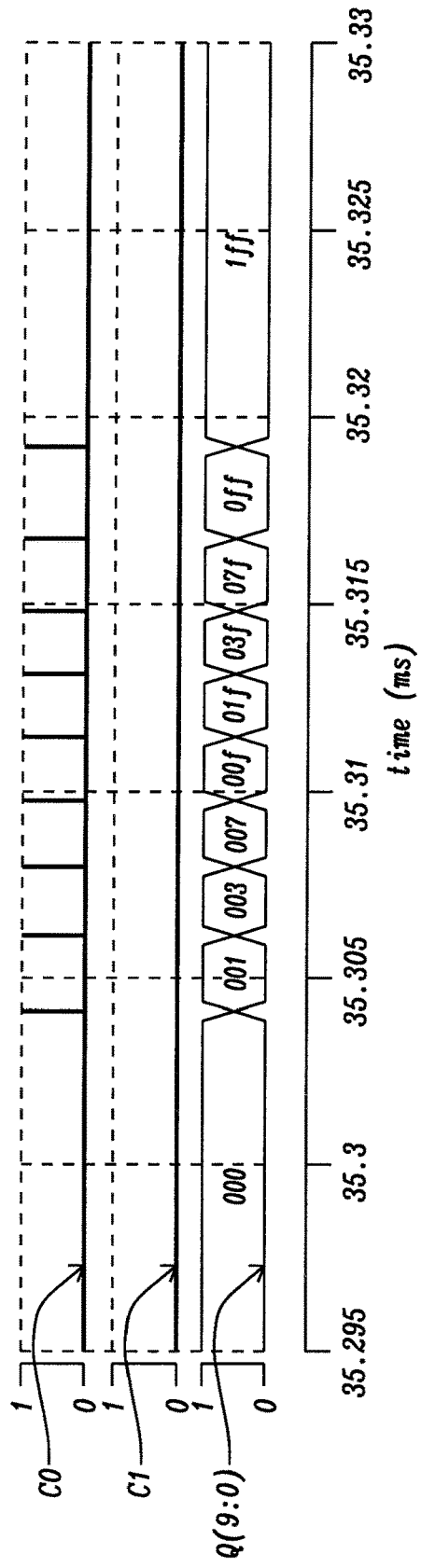

FIG. 7 and FIG. 8 show a zoom-in on the input voltage $V_{in}$ of FIG. 6 wherein also the first and the second predetermined voltage thresholds and the binary value of $C_0$ and $C_1$ and the hexadecimal value of Q are shown. It can be seen that, whenever the diode is conducting, the voltage drop is within the limits $V_{high}$ and $V_{low}$.

The next plots shown in FIG. 8, FIG. 9, FIG. 10, FIG. 11, FIG. 12, FIG. 13, FIG. 14, FIG. 15, FIG. 16 and FIG. 17 are zoom-in's at the time moments indicated by the bars at the horizontal axis of FIG. 8. With a current step, there is a slight overshoot, but since it only takes 10 clocks to go from all switches OFF to all switches ON, the overshoot is very small.

Figure 18:
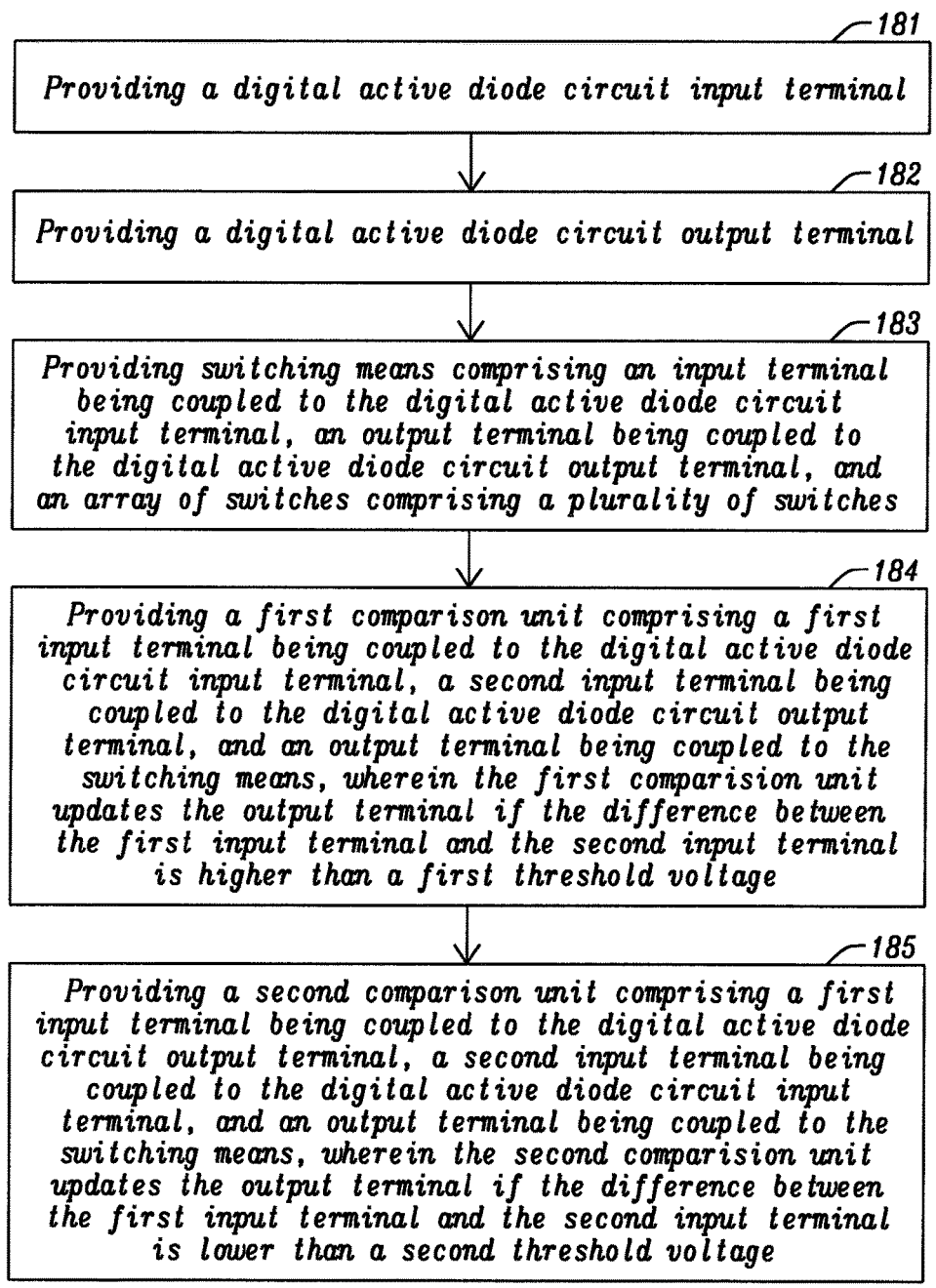
FIG. 18 shows a flowchart of a method of providing an active diode circuit.

FIG. 18 shows a flowchart of a method of providing a digital active diode circuit. Initially, input and output terminals are provided and identified 181, 182. Then, in box 183 a switching means is provided. A first comparison unit is provided 184, wherein the first comparison unit updates the output terminal if the difference between the first input terminal and the second input terminal is higher than a first threshold. Finally, a second comparison unit is provided 185, wherein the second comparison unit updates the output terminal if the difference between the first input terminal and the second input terminal is lower than a first threshold It will be understood that different implementation variations are possible and within reach of the person skilled in the art, based on the present description.

It should be noted that the above-described embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

What is claimed is:

1. A digital active diode circuit for letting current pass in one direction and substantially blocking current in the opposite direction, the digital active diode circuit comprising:
    a digital active diode circuit input terminal;
    a digital active diode circuit output terminal;
    switching means comprising an input terminal being coupled to the digital active diode circuit input terminal, an output terminal being coupled to the digital active diode circuit output terminal, and an array of switches comprising a plurality of switches;
    a first comparison unit comprising a first input terminal being coupled to the digital active diode circuit input terminal, a second input terminal being coupled to the digital active diode circuit output terminal, and an output terminal being coupled to the switching means, wherein the first comparison unit is further configured to update the output terminal if the difference between the first input terminal and the second input terminal is higher than a first threshold voltage; and
    a second comparison unit comprising a first input terminal being coupled to the digital active diode circuit output terminal, a second input terminal being coupled to the digital active diode circuit input terminal, and an output terminal being coupled to the switching means, wherein the second comparison unit is further configured to update the output terminal if the difference between the first input terminal and the second input terminal is lower than a second threshold voltage;
    wherein the switching means is further configured to switch on or off at least one of the plurality of switches based on the comparisons performed by the first comparison unit and the second comparison unit, and wherein the first threshold voltage is different from the second threshold voltage,
    wherein the switching means comprises further a selecting unit comprising a first input coupled to the output of the first comparison unit, a second input coupled to the output of the second comparison unit and a plurality of outputs, wherein each output of the plurality of outputs of the selecting unit is coupled to a different switch of the plurality of switches.

2. The digital active diode circuit of claim 1, wherein the first comparison unit comprises a first operational amplifier having an inverting input, a non-inverting input and an output, wherein the non-inverting input is coupled to the first input terminal of the first comparison unit, the inverting input is coupled to the second input terminal of the first comparison unit through an offset voltage equal to the first threshold voltage, and the output of the first operational amplifier is coupled to the output terminal of the first comparison unit.

3. The digital active diode circuit of claim 1, wherein the second comparison unit comprises a second operational amplifier with an inverting input, a non-inverting input and an output, wherein the inverting input is coupled to the second input terminal of the second comparison unit, the non-inverting input is coupled to the first input terminal of the second comparison unit through an offset voltage equal to the second threshold voltage, and the output is connected to the output terminal of the second comparison unit.

4. The digital active diode circuit of claim 1, wherein the selecting unit is a bidirectional register.

5. The digital active diode circuit of claim 3, wherein the number of switches of the
    plurality of switches is equal to the number of outputs of the plurality of outputs of the selecting unit.

6. The digital active diode circuit of claim 1, wherein the array of switches is binary weighted.

7. The digital active diode circuit of claim 1, wherein the number of switches of the array of switches is equal to 256.

8. The digital active diode circuit of claim 1, wherein switches are transistors.

9. The digital active diode circuit of claim 1, wherein the first threshold voltage is equal to four times the second threshold voltage.

10. The digital active diode circuit of claim 1, further comprising a stabilization circuit wherein the stabilization circuit further comprises an amplifier, a switch and a voltage source wherein the voltage source is configured to provide a voltage substantially equal to half of the result of adding the first threshold voltage and the second threshold voltage, and wherein the third amplifier comprises an inverting input coupled to the input terminal of the digital active diode circuit, a non-inverting terminal coupled to the voltage source and an output coupled to the switch.

11. The digital active diode circuit of claim 1, further comprising a clock connected to the switching means, to the first comparison unit, and to the second comparison unit.

12. A method of providing a digital active diode circuit for letting current pass in one direction and substantially blocking current in the opposite direction, the digital active diode circuit comprising the steps of:

providing a digital active diode circuit input terminal;

providing a digital active diode circuit output terminal;

providing switching means comprising an input terminal being coupled to the digital active diode circuit input terminal, an output terminal being coupled to the digital active diode circuit output terminal, and an array of switches comprising a plurality of switches;

providing a first comparison unit comprising a first input terminal being coupled to the digital active diode circuit input terminal, a second input terminal being coupled to the digital active diode circuit output terminal, and an output terminal being coupled to the switching means, wherein the first comparison unit updates the output terminal if the difference between the first input terminal and the second input terminal is higher than a first threshold voltage; and providing a second comparison unit comprising a first input terminal being coupled to the digital active diode circuit output terminal, a second input terminal being coupled to the digital active diode circuit input terminal, and an output terminal being coupled to the switching means, wherein the second comparison unit updates the output terminal if the difference between the first input terminal and the second input terminal is lower than a second threshold voltage;

wherein the switching means switches on or off at least one of the plurality of switches based on the comparisons performed by the first comparison unit and the second comparison unit, and wherein the first threshold voltage is different from the second threshold voltage, wherein the switching means comprises further a selecting unit comprising a first input coupled to the output of the first comparison unit, a second input coupled to the output of the second comparison unit and a plurality of outputs, wherein each output of the plurality of outputs of the selecting unit is coupled to a different switch of the plurality of switches.

13. The method of claim 12, wherein the first comparison unit comprises a first operational amplifier having an inverting input, a non-inverting input and an output, wherein the non-inverting input is coupled to the first input terminal of the first comparison unit, the inverting input is coupled to the second input terminal of the first comparison unit through an offset voltage equal to the first threshold voltage, and the output of the first operational amplifier is coupled to the output terminal of the first comparison unit.

14. The method of claim 12, wherein the second comparison unit comprises a second operational amplifier with an inverting input, a non-inverting input and an output, wherein the inverting input is coupled to the second input terminal of the second comparison unit, the non-inverting input is coupled to the first input terminal of the second comparison unit through an offset voltage equal to the second threshold voltage, and the output is connected to the output terminal of the second comparison unit.

15. The method of claim 12, wherein the selecting unit is a bidirectional register.

16. The method of claim 12, wherein the number of switches of the plurality of switches is equal to the number of outputs of the plurality of outputs of the selecting unit.

17. The method of claim 12 wherein the array of switches is binary weighted.

18. The method of claim 12, wherein the number of switches of the array of switches is equal to 256.

* * * * *